United States Patent
Lin et al.

(10) Patent No.: US 9,853,635 B2
(45) Date of Patent: Dec. 26, 2017

(54) DOUBLE FREQUENCY-SHIFT KEYING MODULATING DEVICE

(71) Applicant: National Chi Nan University, Puli, Nantou (TW)

(72) Inventors: Yo-Sheng Lin, Nantou (TW); Chien-Chu Chi, Nantou (TW); Ching-Hung Peng, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 0 days.

(21) Appl. No.: 15/242,539

(22) Filed: Aug. 21, 2016

(65) Prior Publication Data

US 2017/0187366 A1    Jun. 29, 2017

(30) Foreign Application Priority Data

Dec. 24, 2015   (TW) .............................. 104143575 A (51) Int. Cl.
    H03K 7/06    (2006.01)
    H02M 3/07    (2006.01)
    H03B 5/12    (2006.01)
    H03L 7/18    (2006.01)

(52) U.S. Cl.
    CPC ................ *H03K 7/06* (2013.01); *H02M 3/07* (2013.01); *H03B 5/1212* (2013.01); *H03L 7/18* (2013.01)

(58) Field of Classification Search
    CPC ......... H03K 7/06; H02M 3/07; H03B 5/1212; H03L 7/18
    See application file for complete search history.

(56) References Cited

U.S. PATENT DOCUMENTS 4,290,022 A *  9/1981  Puckette ................ H03K 5/131
                                                  327/152
8,571,161 B2 * 10/2013  Levantino .............. H03B 27/00
                                                  375/295

* cited by examiner

*Primary Examiner* — Jung Kim
(74) *Attorney, Agent, or Firm* — Merchant & Gould P.C.

(57) ABSTRACT

A double frequency-shift keying modulating device includes a modulation module. The modulation module receives an oscillating signal and a digital signal, and generates a modulation output signal that has a first frequency. The first frequency is associated with a frequency of the oscillating signal and varies periodically at a second frequency. The second frequency is associated with the digital signal and the frequency of the oscillating signal.

15 Claims, 7 Drawing Sheets

DOUBLE FREQUENCY-SHIFT KEYING MODULATING DEVICE

CROSS-REFERENCE TO RELATED APPLICATION

This application claims priority of Taiwanese Patent Application No. 104143575, filed on Dec. 24, 2015.

FIELD

The disclosure relates to a modulating device, and more particularly to a double frequency-shift keying modulating device.

BACKGROUND

A conventional double frequency-shift keying modulating device includes a frequency synthesizer circuit, a frequency divider circuit, a digital modulation circuit and an analog modulation circuit. The frequency synthesizer circuit is used to generate an oscillating signal based on an external reference input signal. The frequency divider circuit is used to generate first and second frequency division signals based on the oscillating signal from the frequency synthesizer circuit. The digital modulation circuit is used to generate a modulation signal based on an external digital signal, and the first and second frequency division signals from the frequency divider circuit. The analog modulation circuit is used to generate a modulation output signal based on the modulation signal from the digital modulation circuit.

However, for the conventional double frequency-shift keying modulating device, there is still room for improvement on power consumption of the analog modulation circuit.

SUMMARY

Therefore, an object of the disclosure is to provide a double frequency-shift keying modulating device that can overcome the drawback of the prior art.

According to the disclosure, the double frequency-shift keying modulating device includes a modulation module. The modulation module is disposed to receive an oscillating signal and a digital signal, and is configured to generate a modulation output signal that has a first frequency. The first frequency is associated with a frequency of the oscillating signal and varies periodically at a second frequency, and the second frequency is associated with the digital signal and the frequency of the oscillating signal.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

In addition, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout this disclosure should be interpreted as being such when looking at those elements alone.

Figure 1A:
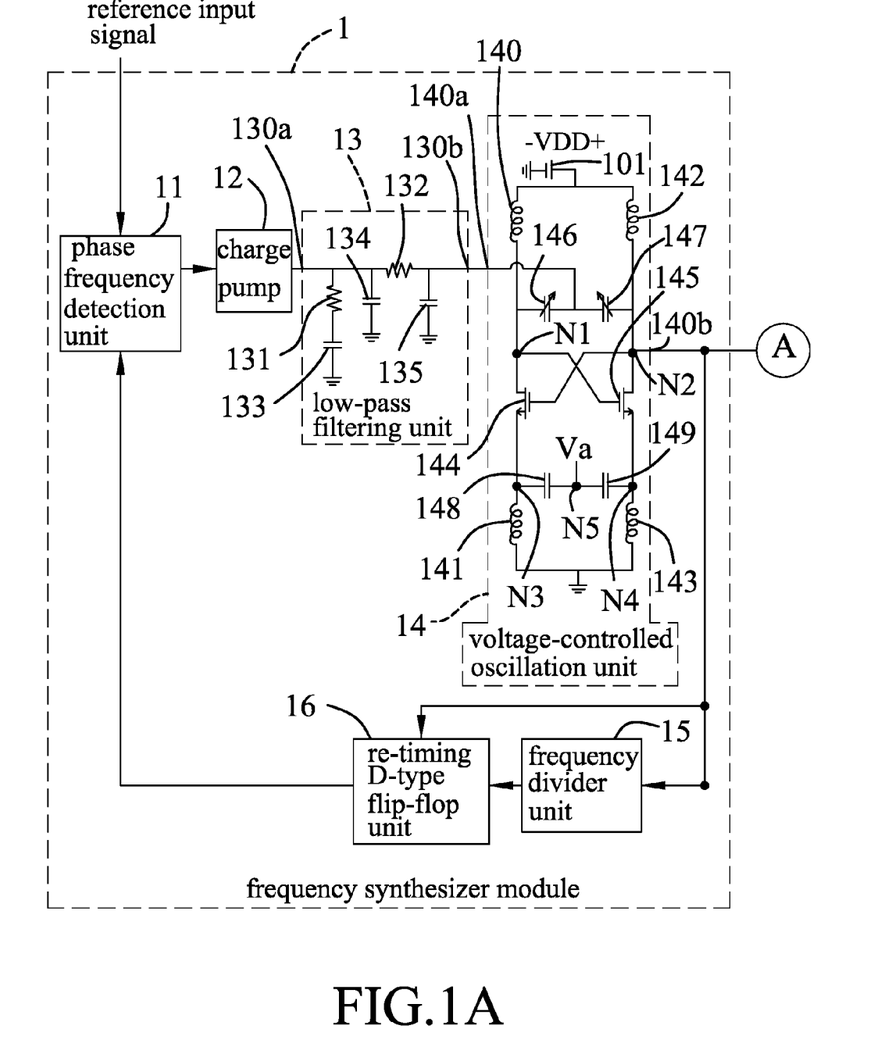
FIGS. 1A and 1B are a schematic electrical circuit block diagram illustrating an embodiment of a double frequency-shift keying modulating device according to the disclosure.
Figure 1B:
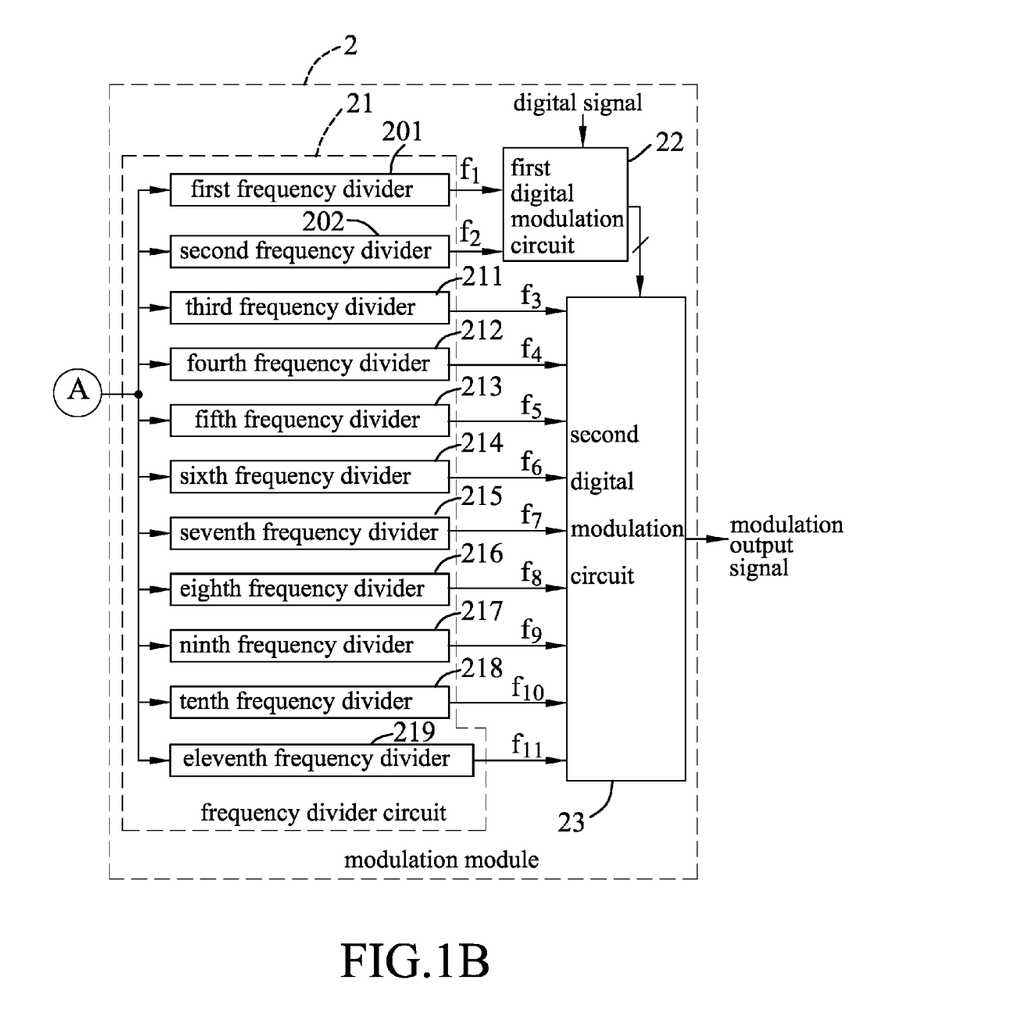

Referring to FIGS. 1A and 1B, an embodiment of a double frequency-shift keying modulating device according to the disclosure is shown to include a frequency synthesizer module 1 and a modulation module 2.

The frequency synthesizer module 1 receives a reference input signal, and is configured to generate an oscillating signal based on the reference input signal. In this embodiment, the frequency synthesizer module 1 includes a phase frequency detection unit 11, a charge pump 12, a low-pass filtering unit 13, a voltage-controlled oscillation unit 14, a frequency divider unit 15 and a re-timing D-type flip-flop unit 16.

The phase frequency detection unit 11 is used to receive the reference input signal and an adjustment signal, and is configured to generate a detection signal based on the reference input signal and the adjustment signal.

The charge pump 12 is coupled to the phase frequency detection unit 11 for receiving the detection signal therefrom, and is configured to generate a voltage signal based on the detection signal.

The low-pass filtering unit 13 is coupled to the charge pump 12 for receiving the voltage signal therefrom, and is configured to filter the voltage signal so as to generate a filtered signal. In this embodiment, the low-pass filtering unit 13 includes an input terminal (130a), an output terminal (130b), first and second resistors 131, 132, and first to third capacitors 133, 134, 135.

The input terminal (130a) is coupled to the charge pump 12 for receiving the voltage signal therefrom. The output terminal (130b) is configured to output the filtered signal. The first resistor 131 and the first capacitor 133 are coupled in series between the input terminal (130a) and ground. The first resistor 131 is coupled to the input terminal (130a). The first capacitor 133 is coupled to ground. The second capacitor 134 is coupled between the input terminal (130a) and ground. The second resistor 132 is coupled between the input terminal (130a) and the output terminal (130b). The third capacitor 135 is coupled between the output terminal (130b) and ground.

The voltage-controlled oscillation unit 14 is coupled to the output terminal (130b) of the low-pass filtering unit 13 for receiving the filtered signal therefrom, and is configured to generate the oscillating signal based on the filtered signal. A frequency of the oscillating signal is, for example, 3.6 GHz. In this embodiment, the voltage-controlled oscillation unit 14 includes an input terminal (140a), an output terminal (140b), first to fourth inductors 140, 141, 142, 143, first and second transistors 144, 145, and first to fourth capacitors 146, 147, 148, 149.

The input terminal (140a) is coupled to the output terminal (130b) for receiving the filtered signal therefrom. The output terminal (140b) is used for outputting the oscillating signal. The first inductor 140, the first transistor 144 and the second inductor 141 are coupled in series in the given order between a voltage source 101 and ground. The first inductor 140 is configured to receive a direct current (DC) bias voltage (VDD) from the voltage source 101. The second inductor 141 is coupled to ground. The first transistor 144 has a control terminal that is coupled to the output terminal (140b). The third inductor 142, the second transistor 145 and the fourth inductor 143 are coupled in series in the given order between the voltage source 101 and ground. The third inductor 142 is configured to receive the DC bias voltage (VDD) from the voltage source 101. The fourth inductor 143 is coupled to ground. The second transistor 145 has a control terminal that is coupled to a first common node (N1) of the first inductor 140 and the first transistor 144. A second common node (N2) of the third inductor 142 and the second transistor 145 is coupled to the output terminal (140b). The first capacitor 146 is coupled between the input terminal (140a) and the first common node (N1). The second capacitor 147 is coupled between the input and output terminals (140a, 140b). The third and fourth capacitors 148, 149 are coupled in series between a third common node (N3) of the first transistor 144 and the second inductor 141, and a fourth common node (N4) of the second transistor 145 and the fourth inductor 143. A fifth common node (N5) of the third and fourth capacitors 148, 149 is used to receive a predetermined adjustment voltage (Va). It should be noted that each of the first and second transistors 144, 145 further has a first terminal and a second terminal. The first and second terminals of the first transistor 144 are coupled respectively to the first common node (N1) and the third common node (N3). The first and second terminals of the second transistor 145 are coupled respectively to the second common node (N2) and the fourth common node (N4). In this embodiment, each of the first and second transistors 144, 145 is, for example, an N-type MOSFET, which has a drain, a source and a gate serving respectively as the first, second and control terminals thereof. In addition, each of the first and second capacitors 146, 147 is, for example, an adjustable capacitor.

The frequency divider unit 15 is coupled to the output terminal (140b) of the voltage-controlled oscillation unit 14 for receiving the oscillating signal therefrom, and is configured to generate a frequency division output signal based on the oscillating signal. In this embodiment, a predetermined frequency division number of the frequency divider unit 15 is, for example, 45.

The re-timing D-type flip-flop unit 16 is coupled to the frequency divider unit 15, the output terminal (140b) and the phase frequency detection unit 11, and receives the frequency division output signal and the oscillating signal respectively from the frequency divider unit 15 and the voltage-controlled oscillation unit 14. The re-timing D-type flip-flop unit 16 is configured to generate the adjustment signal based on the frequency division output signal and the oscillating signal and to output the adjustment signal to the phase frequency detection unit 11.

In this embodiment, the modulation module 2 is coupled to the output terminal (140b) of the voltage-controlled oscillation unit 14, and includes a frequency divider circuit 21 and first and second digital modulation circuits 22, 23.

The frequency divider circuit 21 is coupled to the output terminal (140b) for receiving the oscillating signal therefrom, and is configured to generate a first frequency division signal to an $M^{th}$ frequency division signal based on the oscillating signal, where M≥5. In this embodiment, for example, M=11. In this way, the frequency divider circuit 21 generates the first to eleventh frequency division signals ($f_1$-$f_{11}$), and includes frequency dividers 201, 202, 211-219.

The frequency dividers 201, 202, 211-219 are coupled to the output terminal (140b) for receiving the oscillating signal therefrom, and are configured to respectively generate the frequency division signals ($f_1$-$f_{11}$) based on the oscillating signal. It should be noted that each of the frequency dividers 201, 202 is, for example, a programmable frequency divider. Each of the frequency dividers 211-219 is, for example, a non-programmable frequency divider with a predetermined individual frequency division number. In this embodiment, the predetermined individual frequency division numbers of the frequency dividers 211-219 are respectively 90, 72, 60, 50, 45, 40, 36, 33 and 30.

Figure 2:
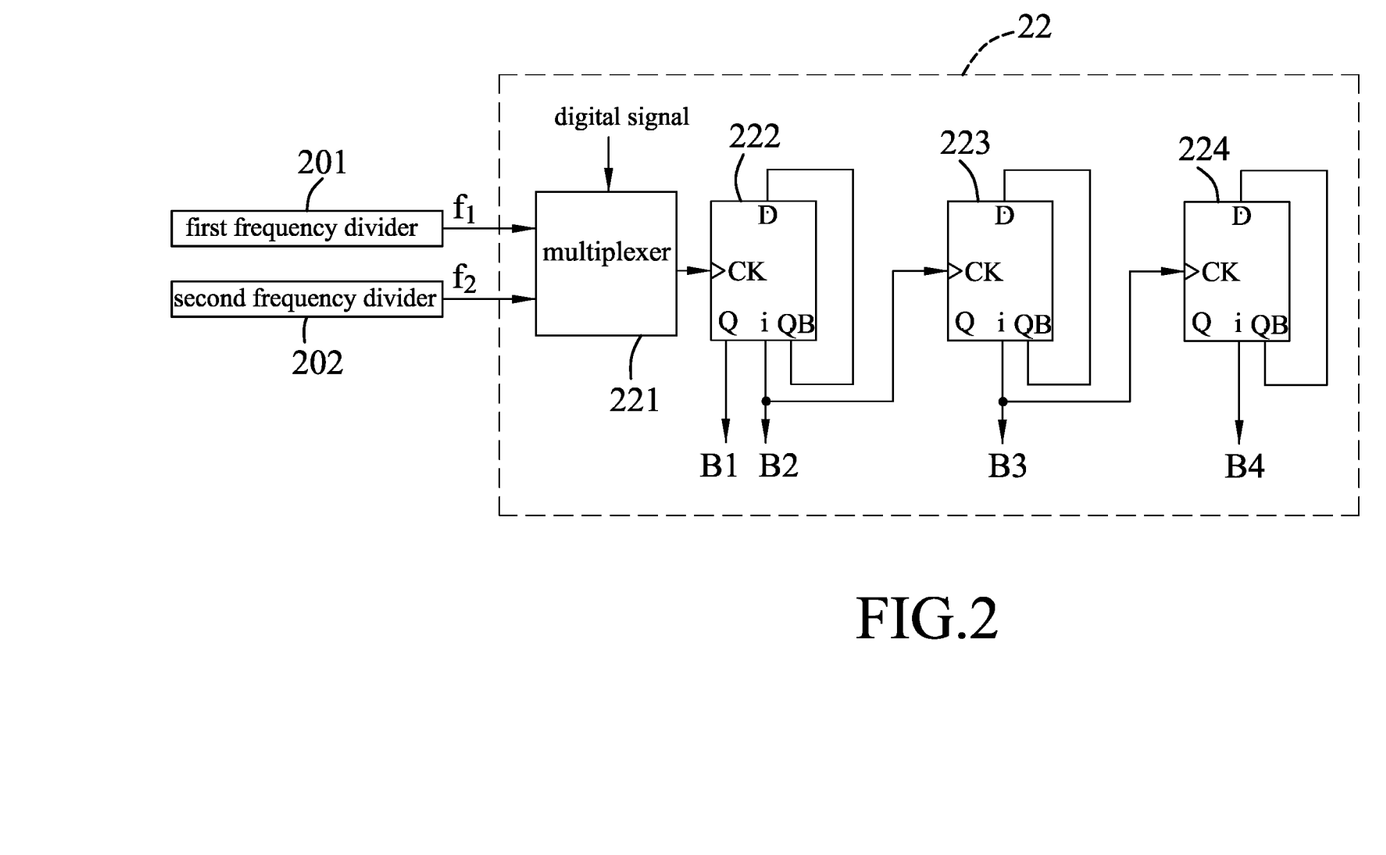
FIG. 2 is a schematic block diagram illustrating a first digital modulation circuit of the embodiment.

Referring to FIG. 2, the first digital modulation circuit 22 is coupled to the frequency dividers 201, 202 for respectively receiving a first set of the frequency division signals therefrom, and is configured to generate a digital output that varies periodically based on the first set of the frequency division signals and a digital signal. In this embodiment, the first set of the frequency division signals includes the frequency division signals ($f_1$, $f_2$), and the digital output is a J-bit signal that has first to $J^{th}$ bits, where J≥2. The first digital modulation circuit 22 may include, but is not limited to, a multiplexer 221 and a number K of cascaded flip-flops, where K=J−1≥1. In this embodiment, for example, J=4 and K=3. Therefore, four bits (B1, B2, B3, B4) cooperatively constituting the J-bit signal and three cascaded flip-flops 222, 223, 224 are shown in FIG. 2.

In this embodiment, the multiplexer 221 has a control terminal that receives the digital signal, a first input terminal that is coupled to the frequency divider 201 for receiving the first frequency division signal ($f_1$) therefrom, a second input terminal that is coupled to the frequency divider 202 for receiving the second frequency division signal ($f_2$) therefrom, and an output terminal for outputting an output signal. The multiplexer 221 is operated based on the digital signal so that the output signal is the first frequency division signal ($f_1$) when the digital signal has a logic low level, and is the second frequency division signal ($f_2$) when the digital signal has a logic high level, but the disclosure is not limited thereto.

In this embodiment, each of the flip-flops 222, 223, 224 is a re-timing D-type flip-flop, and has a data input terminal (D) and an inverting data output terminal (QB) that are coupled to each other, a clock input terminal (CK), a non-inverting data output terminal (Q) and a phase delay output terminal (i). In this embodiment, a signal outputted at the phase delay output terminal (i) has a phase delayed behind a signal outputted at the non-inverting data output terminal (Q) by half a cycle (i.e., 180°) of a periodic signal inputted to the clock input terminal (CK) for each of the flip-flops 222, 223, 224. The clock input terminal (CK) of the flip-flop 222 is coupled to the output terminal of the multiplexer 221 for receiving the output signal therefrom.

The flip-flop 222 is configured to output the first and second bits (B1, B2) respectively at the non-inverting data output terminal (Q) and the phase delay output terminal (i) thereof. The clock input terminal (CK) of an $n^{th}$ one of the flip-flops is coupled to the phase delay output terminal (i) of an $(n-1)^{th}$ one of the flip-flops, where $2 \leq n \leq 3$ in this embodiment. The $n^{th}$ one of the flip-flops is configured to output the $(n+1)^{th}$ bit of the J-bit signal at the phase delay output terminal (i) thereof.

Referring again to FIGS. 1A and 1B, the second digital modulation circuit 23 is coupled to the frequency dividers 211-219 for receiving a second set of the frequency division signals (i.e., the frequency division signals ($f_3$-$f_{11}$) in this embodiment) therefrom, and to the first digital modulation circuit 22 for receiving the J-bit signal therefrom. The second digital modulation circuit 23 is configured to generate a modulation output signal based on the frequency division signals ($f_3$-$f_{11}$) and the J-bit signal.

Figure 3:
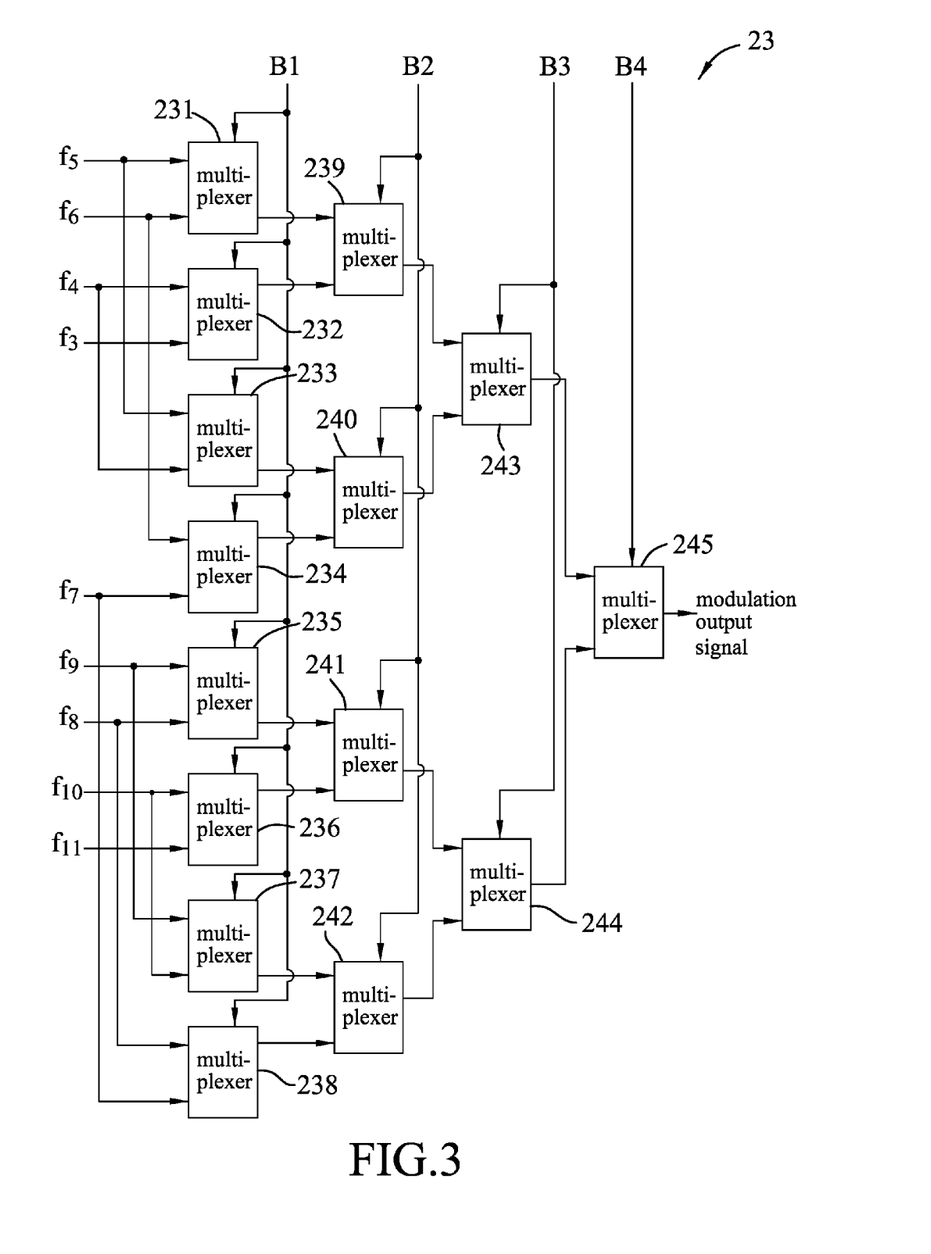
FIG. 3 is a schematic block diagram illustrating a second digital modulation circuit of the embodiment.

Referring further to FIGS. 2 and 3, the second digital modulation circuit 23 includes $2^J-1$ multiplexers 231-245, each of which has a first input terminal, a second input terminal, an output terminal, and a control terminal, and is configured based on a signal at the control terminal thereof to establish electrical connection between the output terminal thereof and one of the first and second input terminals thereof. The $2^J-1$ multiplexers 231-245 are divided into first to $J^{th}$ multiplexer groups that respectively includes $2^{J-1}$ to $2^0$ of the $2^J-1$ multiplexers. Each of the first to $J^{th}$ multiplexer groups receives a respective one of the first to $J^{th}$ bit of the J-bit signal for provision to the control terminal of each of the multiplexer(s) thereof. The first and second input terminals of each of the multiplexers 231-238 of the first multiplexer group are coupled to the frequency divider circuit 21 for respectively receiving therefrom two of the frequency division signals among the second set of frequency division signals ($f_3$-$f_{11}$). The first and second input terminals of each of the multiplexers of the $m^{th}$ multiplexer group are respectively coupled to the output terminals of two of the multiplexers of said $(m-1)^{th}$ multiplexer group, where $2 \leq m \leq J$. The multiplexer 245 of the $J^{th}$ multiplexer group outputs the modulation output signal at the output terminal thereof.

In this embodiment, each of the multiplexers 231-245 operates based on a signal at the control terminal thereof so that the multiplexer 231-245 establishes an electrical connection between the output terminal and the first input terminal thereof when the signal at the control terminal thereof has a logic low level, and establishes an electrical connection between the output terminal and the second input terminal thereof when the signal at the control terminal thereof has a logic high level. For the multiplexers 231-238 (i.e., the first multiplexer group), the control terminals are coupled to the non-inverting data output terminal (Q) of the flip-flop 222 for receiving the bit (B1) therefrom, the first input terminals are coupled to the frequency divider circuit 21 for respectively receiving the frequency division signals ($f_5$, $f_4$, $f_5$, $f_6$, $f_9$, $f_{10}$, $f_9$, $f_{11}$) therefrom, and the second input terminals are coupled to the frequency divider circuit 21 for respectively receiving the frequency division signals ($f_6$, $f_3$, $f_4$, $f_7$, $f_8$, $f_{11}$, $f_{10}$, $f_7$) therefrom. For the multiplexers 239-242 (i.e., the second multiplexer group), the control terminals are coupled to the phase delay output terminal (i) of the flip-flop 222 for receiving the bit (B2) therefrom, the first input terminals are coupled respectively to the output terminals of the multiplexers 231, 233, 235, 237, and the second input terminals are coupled respectively to the output terminals of the multiplexers 232, 234, 236, 238. For the multiplexers 243, 244 (i.e., the third multiplexer group), the control terminals are coupled to the phase delay output terminal (i) of the flip-flop 223 for receiving the bit (B3) therefrom, the first input terminals are coupled respectively to the output terminals of the multiplexers 239, 241, and the second input terminals are coupled respectively to the output terminals of the multiplexers 240, 242. For the multiplexer 245 (i.e., the fourth multiplexer group), the control terminal is coupled to the phase delay output terminal (i) of the flip-flop 224 for receiving the bit (B4) therefrom, the first and second input terminals are coupled respectively to the output terminals of the multiplexers 243, 244, and the output terminal outputs the modulation output signal.

Figure 4:
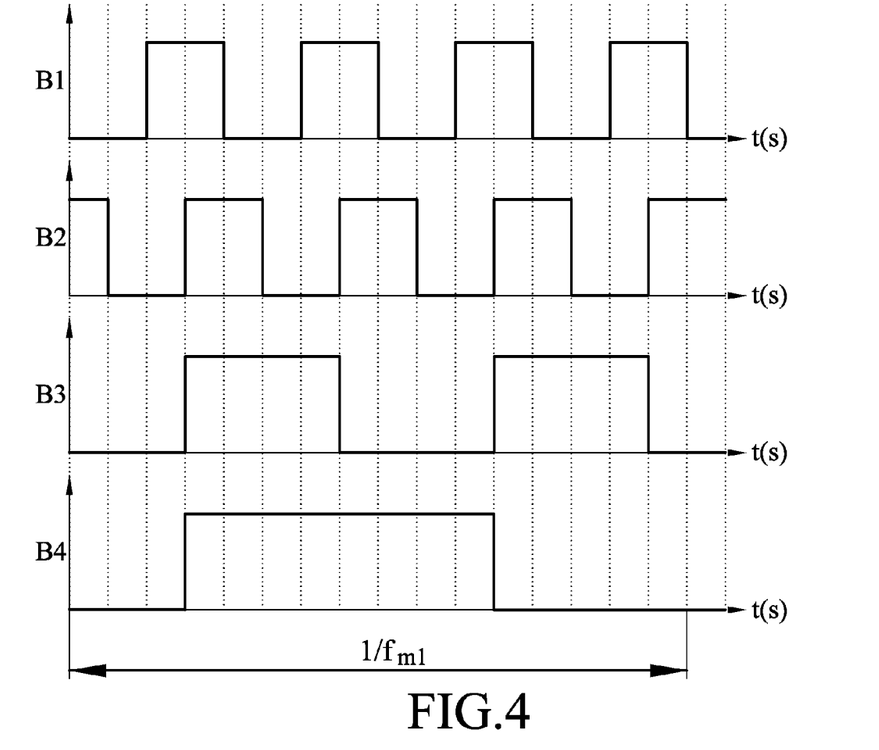
FIG. 4 is a timing diagram illustrating first to fourth bits of a J-bit signal when an output signal of a multiplexer of the first digital modulation circuit is a first frequency division signal of the embodiment.
Figure 5:
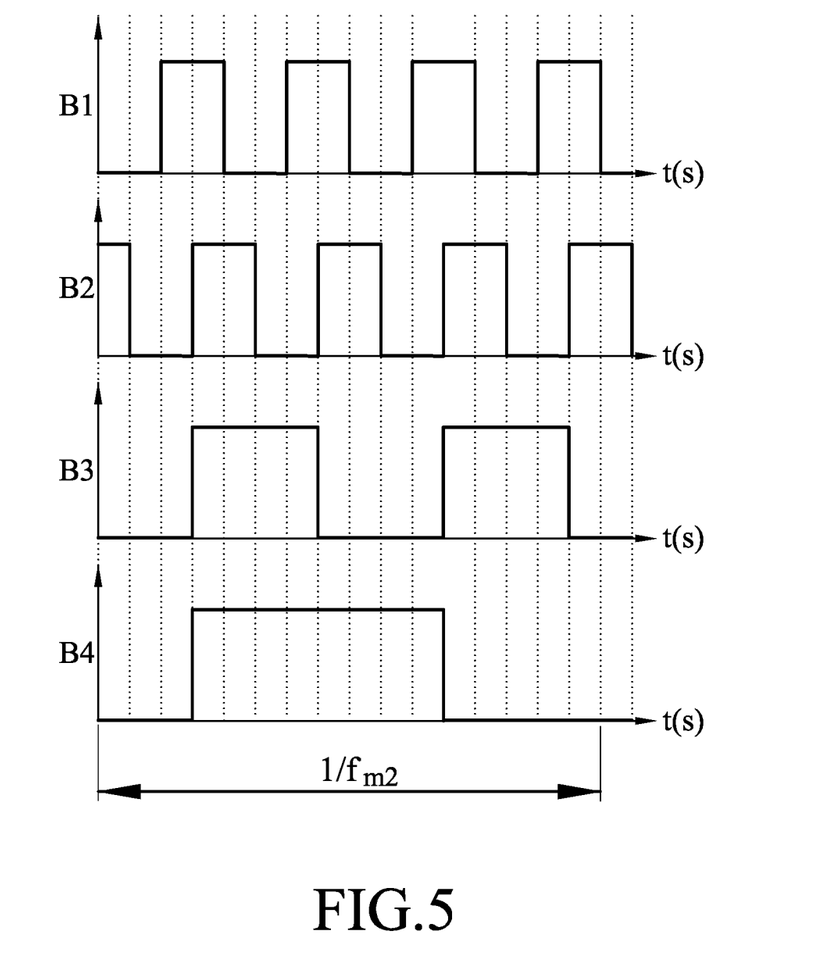
FIG. 5 is a timing diagram illustrating the first to fourth bits of the J-bit signal when the output signal of the multiplexer of the first digital modulation circuit is a second frequency division signal of the embodiment.
Figure 6:
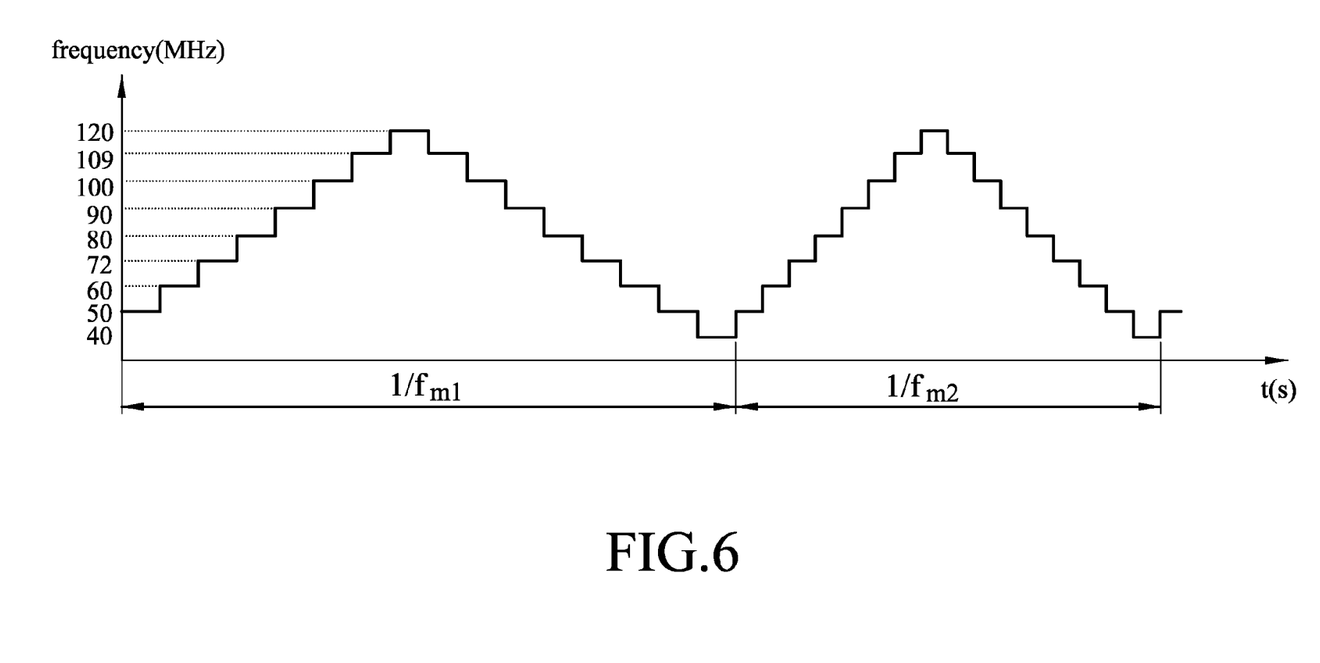
FIG. 6 is a plot illustrating frequency versus time for a modulation output signal of the embodiment.

For example, when the frequency of the oscillating signal is 3.6 GHZ, the predetermined individual frequency division numbers of the frequency dividers 201, 202, 211-219 may respectively be set to be, for example, 180, 18000, 90, 72, 60, 50, 45, 40, 36, 33 and 30, such that the frequencies of the frequency division signals ($f_1$-$f_{11}$) are respectively 20 MHz, 0.2 MHz, 40 MHz, 50 MHz, 60 MHz, 72 MHz, 80 MHz, 90 MHz, 100 MHz, 109 MHz and 120 MHz. In this case, FIG. 4 illustrates waveforms of the bits (B1, B2, B3, B4) when the output signal of the multiplexer 221 is the frequency division signal ($f_1$), FIG. 5 illustrates the waveforms of the bits (B1, B2, B3, B4) when the output signal of the multiplexer 221 is the second frequency division signal ($f_2$), and FIG. 6 illustrates frequency versus time for the modulation output signal when the output signal of the multiplexer 221 is sequentially the first and second frequency division signals ($f_1$, $f_2$), where t represents time, and each of $f_{m1}$ and $f_{m2}$ is a frequency of a sub-frequency signal. It can be seen from FIG. 6 that the modulation output signal has a first frequency that varies among the frequencies of the frequency division signals ($f_3$-$f_{11}$) periodically at a second frequency ($f_{m1}$ or $f_{m2}$) which is associated with the frequency division signals ($f_1$, $f_2$) and the digital signal. In this embodiment, the frequency ($f_{m1}$) is 2.5 MHz (=(frequency of $f_1$)/8=20/8 MHz), and the frequency ($f_{m2}$) is 0.025 MHz (=(frequency of $f_2$)/8=0.2/8 MHz).

In addition, measurement results of the double frequency-shift keying modulating device of this disclosure implemented with a particular semiconductor manufacturing process are shown in Table 1. The energy consumption of the conventional double frequency-shift keying modulating device is about 1 nJ/b. It is known from Table 1 that the energy consumption for transmitting the digital signal is less than 0.2 nJ/b.

TABLE 1

| TSMC CMOS process | 0.18 μm |
|---|---|
| frequency band of the modulation output signal | 40~120 MHz |
| Data Rate | 1 kb/s~10 Mb/s |
| Numbers of Co-existence | 1~15 |
| Energy Consumption/Bit | <0.2 nJ/b |
| Power Consumption | <1.9 mW |

To sum up, since the multiplexers 221, 231-245 and the flip-flops 222, 223, 224 may be implemented using simple digital logic gates, the multiplexers 221, 231-245 and the flip-flops 222, 223, 224 do not interfere with the DC bias voltage (VDD) and the filtered signal. In addition, since the second digital modulation circuit 23 has a relatively low power consumption, the double frequency-shift keying modulating device of this disclosure consumes relatively low power as compared to the conventional double frequency-shift keying modulating device.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A double frequency-shift keying modulating device comprising:
   a modulation module disposed to receive an oscillating signal and a digital signal, and configured to generate a modulation output signal that has a first frequency, wherein the first frequency is associated with a frequency of the oscillating signal and varies periodically at a second frequency, and the second frequency is associated with the digital signal and the frequency of the oscillating signal.

2. The double frequency-shift keying modulating device of claim 1, wherein said modulation module includes:
   a frequency divider circuit configured to generate, based on the oscillating signal, a plurality of frequency division signals that include a first set of frequency division signals and a second set of frequency division signals;
   a first digital modulation circuit coupled to said frequency divider circuit for receiving the first set of frequency division signals therefrom, disposed to receive the digital signal, and configured to determine the second frequency by selecting, according to the digital signal, one of the frequency division signals among the first set of frequency division signals, and to generate a digital output that varies periodically at the second frequency; and
   a second digital modulation circuit coupled to said frequency divider circuit for receiving the second set of frequency division signals therefrom, coupled to said first digital modulation circuit for receiving the digital output therefrom, and configured to generate the modulation output signal by outputting, according to the digital output, one of the frequency division signals among the second set of frequency division signals.

3. The double frequency-shift keying modulating device of claim 2, wherein:
   the digital output is a J-bit signal that has first to $J^{th}$ bits, where $J \geq 2$;
   said first digital modulation circuit includes
   a multiplexer disposed to receive the digital signal, coupled to said frequency divider circuit for receiving the first set of frequency division signals therefrom, having an output terminal, and configured to selectively output at said output terminal thereof one of the frequency division signals among the first set of frequency division signals based on the digital signal, and
   a number K of cascaded flip-flops, each of which has a data input terminal and an inverting data output terminal coupled to each other, a clock input terminal, a non-inverting data output terminal and a phase delay output terminal, where $K=J-1 \geq 1$;
   when K=1, said clock input terminal of said flip-flop is coupled to said output terminal of said multiplexer, and said flip-flop is configured to output the first and second bits of the J-bit signal respectively at said non-inverting data output terminal and said phase delay output terminal thereof; and
   when $K \geq 2$, said clock input terminal of a first one of said flip-flops is coupled to said output terminal of said multiplexer, the first one of said flip-flops is configured to output the first and second bits of the J-bit signal respectively at said non-inverting data output terminal and said phase delay output terminal thereof, said clock input terminal of an $n^{th}$ one of said flip-flops is coupled to said phase delay output terminal of an $(n-1)^{th}$ one of said flip-flops, and the $n^{th}$ one of said flip-flops is configured to output the $(n+1)^{th}$ bit of the J-bit signal at said phase delay output terminal thereof, where $2 \leq n \leq K$.

4. The double frequency-shift keying modulating device of claim 2, wherein:
   the digital output is a J-bit signal that has first to $J^{th}$ bits, where $J \geq 2$;
   said second digital modulation circuit includes $2^J-1$ multiplexers, each of which has a first input terminal, a second input terminal, an output terminal, and a control terminal, each of said multiplexers being configured based on a signal at said control terminal thereof to establish electrical connection between said output terminal thereof and one of said first and second input terminals thereof;
   said multiplexers are divided into first to $J^{th}$ multiplexer groups that respectively include $2^{J-1}$ to $2^0$ of said multiplexers, and each of said first to $J^{th}$ multiplexer groups receives a respective one of the first to $J^{th}$ bit of the J-bit signal for provision to said control terminal of each of said multiplexer(s) thereof;
   said first and second input terminals of each of said multiplexers of said first multiplexer group are coupled to said frequency divider circuit for respectively receiving therefrom two of the frequency division signals among the second set of frequency division signals;
   said first and second input terminals of each of said multiplexers of said $m^{th}$ multiplexer group are respectively coupled to said output terminals of two of said multiplexers of said $(m-1)^{th}$ multiplexer group, where $2 \leq m \leq J$; and
   said multiplexer of said $J^{th}$ multiplexer group outputs the modulation output signal at said output terminal thereof.

5. The double frequency-shift keying modulating device of claim 1, wherein said modulation module includes:
   a frequency divider circuit configured to generate a first frequency division signal to an $M^{th}$ frequency division signal based on the oscillating signal, where $M \geq 5$;
   a first digital modulation circuit coupled to said frequency divider circuit for receiving the first and second frequency division signals therefrom, and configured to generate a J-bit signal that has first to $J^{th}$ bits based on the first and second frequency division signals and the digital signal, where $J \geq 2$; and a second digital modulation circuit coupled to said frequency divider circuit for receiving the third to $M^{th}$ frequency division signals therefrom and to said first digital modulation circuit for receiving the J-bit signal therefrom, said second digital modulation circuit being configured to generate the modulation output signal based on the third to $M^{th}$ frequency division signals and the J-bit signal.

6. The double frequency-shift keying modulating device of claim 5, wherein:

said first digital modulation circuit includes:

a multiplexer having a control terminal to receive the digital signal, a first input terminal and a second input terminal coupled to said frequency divider circuit for respectively receiving the first and second frequency division signals therefrom, and an output terminal for outputting an output signal, said multiplexer being configured to selectively output one of the first and second frequency division signals based on the digital signal; and a number K of cascaded flip-flops, each of which has a data input terminal and an inverting data output terminal coupled to each other, a clock input terminal, a non-inverting data output terminal and a phase delay output terminal, where $K=J-1\geq 1$;

when K=1, said clock input terminal of said flip-flop is coupled to said output terminal of said multiplexer for receiving the output signal therefrom, and said flip-flop is configured to output the first and second bits of the J-bit signal respectively at said non-inverting data output terminal and said phase delay output terminal thereof; and when $K\geq 2$, said clock input terminal of a first one of said flip-flops is coupled to said output terminal of said multiplexer for receiving the output signal therefrom, the first one of said flip-flops is configured to output the first and second bits of the J-bit signal respectively at said non-inverting data output terminal and said phase delay output terminal thereof, said clock input terminal of an $n^{th}$ one of said flip-flops is coupled to said phase delay output terminal of an $(n-1)^{th}$ one of said flip-flops, and the $n^{th}$ one of said flip-flops is configured to output the $(n+1)^{th}$ bit of the J-bit signal at said phase delay output terminal thereof, where $2\leq n\leq K$.

7. The double frequency-shift keying modulating device of claim 6, wherein each of said flip-flops is a re-timing D-type flip-flop.

8. The double frequency-shift keying modulating device of claim 5, wherein:

said second digital modulation circuit includes $2^J-1$ multiplexers, each of which has a first input terminal, a second input terminal, an output terminal, and a control terminal, each of said multiplexers being configured based on a signal at said control terminal thereof to establish electrical connection between said output terminal thereof and one of said first and second input terminals thereof;

said multiplexers are divided into first to $J^{th}$ multiplexer groups that respectively include $2^{J-1}$ to $2^0$ of said multiplexers, and each of said first to $J^{th}$ multiplexer groups receives a respective one of the first to $J^{th}$ bit of the J-bit signal for provision to said control terminal of each of said multiplexer(s) thereof;

said first and second input terminals of each of said multiplexers of said first multiplexer group are coupled to said frequency divider circuit for respectively receiving two of the third to $M^{th}$ frequency division signals therefrom;

said first and second input terminals of each of said multiplexers of said $m^{th}$ multiplexer group are respectively coupled to said output terminals of two of said multiplexers of said $(m-1)^{th}$ multiplexer group, where $2\leq m\leq 1$; and said multiplexer of said $J^{th}$ multiplexer group outputs the modulation output signal at said output terminal thereof.

9. The double frequency-shift keying modulating device of claim 5, wherein M=11 and J=4;

wherein said second digital modulation circuit includes fifteen multiplexers, each of which has a first input terminal, a second input terminal, an output terminal, and a control terminal, each of said multiplexers being configured based on a signal at said control terminal thereof to establish electrical connection between said output terminal and one of said first and second input terminals;

for first to eighth ones of said multiplexers, said control terminals are coupled to said first digital modulation circuit for receiving the first bit of the J-bit signal therefrom, said first input terminals are coupled to said frequency divider circuit for respectively receiving the fifth, fourth, fifth, sixth, ninth, tenth, ninth and eighth frequency division signals therefrom, and said second input terminals are coupled to said frequency divider circuit for respectively receiving the sixth, third, fourth, seventh, eighth, eleventh, tenth and seventh frequency division signals therefrom;

for ninth to twelfth ones of said multiplexers, said control terminals are coupled to said first digital modulation circuit for receiving the second bit of the J-bit signal therefrom, said first input terminals are coupled respectively to said output terminals of the first, third, fifth and seventh ones of said multiplexers, and said second input terminals are coupled respectively to said output terminals of the second, fourth, sixth and eighth ones of said multiplexers;

for thirteenth and fourteenth ones of said multiplexers, said control terminals are coupled to said first digital modulation circuit for receiving the third bit of the J-bit signal therefrom, said first input terminals are coupled respectively to said output terminals of the ninth and eleventh ones of said multiplexers, and said second input terminals are coupled respectively to said output terminals of the tenth and twelfth ones of said multiplexers; and for a fifteenth one of said multiplexers, said control terminal is coupled to said first digital modulation circuit for receiving the fourth bit of the J-bit signal therefrom, said first and second input terminals are coupled respectively to said output terminals of the thirteenth and fourteenth ones of said multiplexers, and the output terminal outputs the modulation output signal.

10. The double frequency-shift keying modulating device of claim 5, wherein said frequency divider circuit includes:

a first frequency divider and a second frequency divider that are disposed to receive the oscillating signal, and that are configured to respectively generate, based on the oscillating signal, the first and second frequency division signals; and a third frequency divider to an $M^{th}$ frequency divider that are disposed to receive the oscillating signal, and that are configured to respectively generate, based on the oscillating signal, the third to $M^{th}$ frequency division signals.

11. The double frequency-shift keying modulating device of claim 10, wherein each of said first and second frequency dividers is a programmable frequency divider, and each of said third to $M^{th}$ frequency dividers is a non-programmable frequency divider with a predetermined individual frequency division number.

12. The double frequency-shift keying modulating device of claim 1, further comprising a frequency synthesizer module to receive a reference input signal, and configured to generate the oscillating signal based on the reference input signal.

13. The double frequency-shift keying modulating device of claim 12, wherein said frequency synthesizer module includes:
  a phase frequency detection unit to receive the reference input signal and an adjustment signal, and configured to generate a detection signal based on the reference input signal and the adjustment signal;
  a charge pump coupled to said phase frequency detection unit for receiving the detection signal therefrom, and configured to generate a voltage signal based on the detection signal;
  a low-pass filtering unit coupled to said charge pump for receiving the voltage signal therefrom, and configured to filter the voltage signal so as to generate a filtered signal;
  a voltage-controlled oscillation unit coupled to said low-pass filtering unit for receiving the filtered signal therefrom, and configured to generate the oscillating signal based on the filtered signal;
  a frequency divider unit coupled to said voltage-controlled oscillation unit for receiving the oscillating signal therefrom, and configured to generate a frequency division output signal based on the oscillating signal; and
  a re-timing D-type flip-flop unit that is coupled to said frequency divider unit, said voltage-controlled oscillation unit and said phase frequency detection unit, that receives the frequency division output signal and the oscillating signal respectively from said frequency divider unit and said voltage-controlled oscillation unit, and that is configured to generate the adjustment signal based on the frequency division output signal and the oscillating signal.

14. The double frequency-shift keying modulating device of claim 13, wherein said low-pass filtering unit includes:
  an input terminal coupled to said charge pump for receiving the voltage signal therefrom;
  an output terminal at which the filtered signal is outputted;
  a series connection of a first resistor and a first capacitor that is coupled between said input terminal and ground;
  a second capacitor coupled between said input terminal and ground;
  a second resistor coupled between said input terminal and said output terminal; and
  a third capacitor coupled between said output terminal and ground.

15. The double frequency-shift keying modulating device of claim 13, wherein said voltage-controlled oscillation unit includes:
  an input terminal coupled to said low-pass filtering unit for receiving the filtered signal therefrom;
  an output terminal at which the oscillating signal is outputted;
  a series connection of a first inductor, a first transistor and a second inductor to be coupled in order between a voltage source and ground, said first transistor having a control terminal that is coupled to said output terminal;
  a series connection of a third inductor, a second transistor and a fourth inductor that is coupled in order between the voltage source and ground, said second transistor having a control terminal that is coupled to a common node of said first inductor and said first transistor, a common node of said third inductor and said second transistor being coupled to said output terminal;
  a first capacitor coupled between said input terminal and said first common node;
  a second capacitor coupled between said input and output terminals; and
  a series connection of a third capacitor and a fourth capacitor that is coupled between a common node of said first transistor and said second inductor, and a common node between said second transistor and said fourth inductor, a common node of said third and fourth inductors being disposed to receive a predetermined adjustment voltage.

* * * * *